United States Patent
Kim

(10) Patent No.: US 9,391,126 B2
(45) Date of Patent: Jul. 12, 2016

(54) FLAT PANEL DISPLAY AND METHOD OF MANUFACTURING THE SAME

(75) Inventor: Sun-Hwa Kim, Yongin (KR)

(73) Assignee: Samsung Display Co., Ltd., Gyeonggi-do (KR)

(*) Notice: Subject to any disclaimer, the term of this patent is extended or adjusted under 35 U.S.C. 154(b) by 1162 days.

(21) Appl. No.: 13/032,567

(22) Filed: Feb. 22, 2011

(65) Prior Publication Data

US 2011/0205470 A1    Aug. 25, 2011

(30) Foreign Application Priority Data

Feb. 23, 2010 (KR) .................. 10-2010-0016334

(51) Int. Cl.
| | |
|---|---|
| G02F 1/1343 | (2006.01) |
| H01L 27/32 | (2006.01) |
| H01L 51/52 | (2006.01) |
| G02F 1/1335 | (2006.01) |
| G02F 1/13363 | (2006.01) |

(52) U.S. Cl.
CPC ...... *H01L 27/3232* (2013.01); *G02F 1/134363* (2013.01); *G02F 2001/133565* (2013.01); *G02F 2001/133638* (2013.01); *G02F 2201/44* (2013.01); *H01L 51/524* (2013.01)

(58) Field of Classification Search
USPC ................................................ 349/41, 147
See application file for complete search history.

(56) References Cited

U.S. PATENT DOCUMENTS

| 7,006,171 B1 | 2/2006 | Koden et al. |
| 2004/0027518 A1 | 2/2004 | Kato et al. |

(Continued)

FOREIGN PATENT DOCUMENTS

| JP | 8-211832 (A) | 8/1996 |
| JP | 2000-347633 A | 12/2000 |

(Continued)

OTHER PUBLICATIONS

Korean Office Action dated Jun. 14, 2011 for Korean Patent Application No. KR 10-2010-0016334 which corresponds to captioned U.S. Appl. No. 13/032,567.

(Continued)

*Primary Examiner* — Eric Wong

(74) *Attorney, Agent, or Firm* — Knobbe, Martens, Olson & Bear, LLP

(57) ABSTRACT

A flat panel display is disclosed. In one embodiment, the display includes a first substrate and an organic light emitting device formed over the first substrate, wherein the organic light emitting device comprises a first electrode layer, an organic light emitting layer, and a second electrode layer, and wherein the organic light emitting layer is interposed between the first and second electrode layers. The display also includes a second substrate attached to the first substrate by the use of a sealant and an In-Plane Switching (IPS) mode electrode layer formed between the first and second substrates, wherein the IPS mode electrode layer is closer to the second substrate than the first substrate, wherein the IPS mode electrode layer has first and second surfaces opposing each other, and wherein the first surface is closer to the second substrate than the first surface. The display further includes a first alignment layer formed on the second surface of the IPS mode electrode layer and a liquid crystal layer filled in a space formed between the first substrate and the second substrate, wherein at least part of the liquid crystal layer is formed over the organic light emitting device.

18 Claims, 4 Drawing Sheets

(56) References Cited

U.S. PATENT DOCUMENTS

| | | |
|---|---|---|
| 2005/0185131 A1 | 8/2005 | Miyachi et al. |
| 2006/0072047 A1 | 4/2006 | Sekiguchi |
| 2006/0215086 A1 | 9/2006 | Kurasawa |
| 2006/0280881 A1 | 12/2006 | Park |
| 2007/0109465 A1 | 5/2007 | Jung et al. |
| 2007/0158656 A1 | 7/2007 | Lee et al. |
| 2008/0278644 A1 | 11/2008 | Fukami et al. |
| 2008/0316410 A1* | 12/2008 | Fujii et al. ............ 349/139 |
| 2009/0066896 A1 | 3/2009 | Kawashima et al. |

FOREIGN PATENT DOCUMENTS

| | | |
|---|---|---|
| JP | 2002-268042 A | 9/2002 |
| JP | 2004-45769 (A) | 2/2004 |
| JP | 2006-018282 (A) | 1/2006 |
| JP | 2006-251701 A | 9/2006 |
| JP | 2006-276111 A | 10/2006 |
| JP | 2006-350347 A | 12/2006 |
| JP | 2008-288376 A | 11/2008 |
| JP | 2009-003285 A | 1/2009 |
| JP | 2009-15316 A | 1/2009 |
| JP | 2009-20505 A | 1/2009 |
| JP | 2009-064047 A | 3/2009 |
| JP | 2009-198932 A | 9/2009 |
| KR | 10-2006-0009134 A | 1/2006 |
| KR | 10-2006-0097927 A | 9/2006 |
| KR | 10-2007-0051500 A | 5/2007 |
| KR | 10-2007-0063314 A | 6/2007 |
| KR | 10-2008-0089793 A | 10/2008 |
| WO | WO 2004/053819 A1 | 6/2004 |
| WO | WO 2007/129420 A1 | 11/2007 |
| WO | WO 2008/153087 A1 | 12/2008 |

OTHER PUBLICATIONS

Korean Registration Determination Certificate dated Feb. 27, 2012 for Korean Patent Application No. KR 10-2010-0016334 which corresponds to captioned U.S. Appl. No. 13/032,567.

Japanese Office Action dated Aug. 26, 2014 for Japanese Patent Application No. JP 2011-003187 which shares priority of Korean Patent Application No. KR 10-2010-0016334 with captioned U.S. Appl. No. 13/032,567, and cites the above-identified references numbered 8-18.

Japanese Office Action dated Jan. 20, 2015 for Japanese Patent Application No. JP 2011-003187 which shares priority of Korean Patent Application No. KR 10-2010-0016334 with captioned U.S. Appl. No. 13/032,567, and cites the above-identified references numbered 2-4.

* cited by examiner

FLAT PANEL DISPLAY AND METHOD OF MANUFACTURING THE SAME

CROSS-REFERENCE TO RELATED PATENT APPLICATION

This application claims the benefit of Korean Patent Application No. 10-2010-0016334, filed on Feb. 23, 2010, in the Korean Intellectual Property Office, the disclosure of which is incorporated herein in its entirety by reference.

BACKGROUND

1. Field

The described technology generally relates to a flat panel display, and more particularly, to a dual flat panel display of an organic light emitting display (OLED) and a liquid crystal display (LCD).

2. Description of the Related Technology

Flat panel displays such as LCDs or OLEDs have recently received considerable attention for commercial applications.

The OLED is a self-luminous type display that electrically excites fluorescent organic compounds interposed between an anode electrode and a cathode electrode. Thus, the OLED may be operable at a low voltage and may be manufactured with a thin panel. In addition, the OLED has a wide viewing angle and a fast response time.

The LCD is a device that changes an optical anisotropy of liquid crystal by applying an electric field to the liquid crystal having liquidity and crystal optical properties, and has less power consumption than a conventional cathode ray tube. In addition, the LCD has additional advantages such as being light weight, thin, simple, and portable, such that a large-scaled screen and high definition may be easily obtained.

SUMMARY

One inventive aspect is a dual flat panel display of an organic light emitting display (OLED) and a liquid crystal display (LCD).

Another aspect is a flat panel display device including: a first substrate; an organic light emitting device on the first substrate and including a first electrode layer, an organic light emitting layer, and a second electrode layer; a sealant on the edges of the first substrate; a second substrate attached to the first substrate by using the sealant as a medium and including an In-Plane Switching (IPS) mode electrode layer on a side facing the first substrate; a first alignment layer on a side of the IPS mode electrode layer facing the first substrate; and a liquid crystal layer filled in a space formed between the first substrate and the second substrate.

At least one of the first electrode layer and the second electrode layer may be a reflective electrode and the IPS mode electrode layer may be a transparent electrode.

Once a predetermined voltage is applied to the IPS mode electrode layer, an image may be realized by distortion of the liquid crystal layer.

The IPS mode electrode layer may be connected to an external terminal on the second substrate.

Once a predetermined voltage is applied to the first electrode layer and the second electrode layer, an image may be realized according to light emission of the organic light emitting layer.

The first electrode layer and the second electrode layer may be connected to an external terminal on the first substrate.

The flat panel display device may further include a second alignment layer on the first substrate and the organic light emitting device, the second alignment layer being aligned in the same direction as the first alignment layer.

The first and second alignment layers may be aligned at 45 degrees with respect to the surface of the first substrate or the second substrate.

The first and second alignment layers may include polyimide.

The sealant may include glass frit.

The flat panel display device may further include a linear polarization film on a side that is opposite to a side of the second substrate facing the first substrate.

The first electrode layer serves as a reflective electrode; the second electrode layer serves as a transparent electrode; and the IPS mode electrode layer serves as a transparent electrode.

The flat panel display device may further include an adhesive material between the second substrate and the linear polarization film.

Another aspect is a method of manufacturing a flat panel display device, the method including: preparing a first substrate and a second substrate, the first substrate including a first electrode layer, an organic light emitting layer, and a second electrode layer, the second substrate including an In-Plane Switching (IPS) mode electrode layer; coating a first alignment layer on a side of one of the first substrate and the second substrate and aligning the first alignment layer; filling liquid crystal in a space formed by the first substrate and the second substrate; and bonding the first substrate and the second substrate and hardening the liquid crystal.

During the preparing of the first substrate and the second substrate, at least one of the first and second substrates may be formed as a reflective electrode and the IPS mode electrode layer may be formed as a transparent electrode.

During the preparing of the first substrate and the second substrate, an external terminal that connects to the first and second electrode layers may be formed on the first substrate and an external terminal that connects to the IPS mode electrode layer may be formed on the second substrate.

During the coating of the first alignment layer and the aligning of the first alignment layer, a second alignment layer may be further coated on one side of one substrate without the coated first alignment layer among the first and second substrates.

The second alignment layer may be aligned in the same direction as the first alignment layer.

The first and second alignment layers may be aligned at 45 degrees with respect to the first substrate or the second substrate.

The first and second alignment layers may include polyimide.

The first and second alignment layers may be aligned through an ultraviolet (UV) photo alignment method.

During the bonding of the first and second substrate and the hardening of the liquid crystal, the liquid crystal may be hardened by UV light.

The method may further include attaching a linear polarization film on a side that is opposite to a side of the second substrate facing the first substrate.

The method may further include disposing an adhesive material between the second substrate and the linear polarization film.

During the bonding of the first and second substrate and the hardening of the liquid crystal, the first substrate and the second substrate may be bonded using a sealant on edge portions of the first substrate or the second substrate.

Another aspect is a flat panel display comprising: a first substrate; an organic light emitting device formed over the first substrate, wherein the organic light emitting device comprises a first electrode layer, an organic light emitting layer, and a second electrode layer, and wherein the organic light emitting layer is interposed between the first and second electrode layers; a second substrate attached to the first substrate by the use of a sealant; an In-Plane Switching (IPS) mode electrode layer formed between the first and second substrates, wherein the IPS mode electrode layer is closer to the second substrate than the first substrate, wherein the IPS mode electrode layer has first and second surfaces opposing each other, and wherein the first surface is closer to the second substrate than the first surface; a first alignment layer formed on the second surface of the IPS mode electrode layer; and a liquid crystal layer filled in a space formed between the first substrate and the second substrate, wherein at least part of the liquid crystal layer is formed over the organic light emitting device.

In the above display, at least one of the first electrode layer and the second electrode layer is formed at least partially of a reflective material and wherein the IPS mode electrode layer is formed at least partially of a transparent material. In the above display, the liquid crystal layer is configured to display an image based on a voltage applied to the IPS mode electrode layer. In the above display, the IPS mode electrode layer is electrically connected to an external terminal formed on the second substrate.

In the above display, the organic light emitting layer is configured to display an image based on a voltage applied to the first electrode layer and the second electrode layer. In the above display, the first electrode layer and the second electrode layer are electrically connected to an external terminal formed on the first substrate.

The above display further comprises a second alignment layer formed over the first substrate and the organic light emitting device, wherein the second alignment layer is aligned in substantially the same direction as the first alignment layer. In the above display, the first and second alignment layers are aligned at about 45 degrees with respect to at least one of a first surface of the first substrate and a second surface of the second substrate, and wherein the sealant contacts the first surface of the first substrate and the second surface of the second substrate. In the above display, the first and second alignment layers are formed at least partially of polyimide. In the above display, the sealant is glass frit.

The above display further comprises a linear polarization film, wherein the second substrate has first and second surfaces opposing each other, wherein the first surface of the second substrate contacts the sealant, and wherein the linear polarization film is formed over the second surface of the second substrate. In the above display, the first electrode layer is formed at least partially of a reflective material, wherein the second electrode layer is formed at least partially of a transparent material and wherein the IPS mode electrode layer is formed at least partially of a transparent material. The above display further comprises an adhesive material formed between the second substrate and the linear polarization film.

Another aspect is a method of manufacturing a flat panel display, the method comprising: providing a first substrate and a second substrate, wherein an organic light emitting device is formed over the first substrate, and wherein an In-Plane Switching (IPS) mode electrode layer is formed on the second substrate; forming a first alignment layer on a first surface of one of the first substrate and the second substrate; filling liquid crystal in a space formed between the first substrate and the second substrate; bonding the first substrate and the second substrate with a sealant; and hardening the liquid crystal.

In the above method, at least one of the first and second substrates is formed at least partially of a reflective material and wherein the IPS mode electrode layer is formed at least partially of a transparent material. In the above method, the organic light emitting device comprises a first electrode layer, an organic light emitting layer and a second electrode layer, wherein the organic light emitting layer is interposed between the first and second electrode layers, and wherein the providing comprises: forming an external terminal on the first substrate to be connected to the first and second electrode layers; and forming an external terminal on the second substrate to be connected to the IPS mode electrode layer.

The above method further comprises forming a second alignment layer on a second surface of the other substrate, wherein the second surface faces the first surface. The above method further comprises aligning the first and second alignment layers through an ultraviolet (UV) photo alignment method. In the above method, the hardening is performed with the use of UV radiation.

Another aspect is a flat panel display comprising: first and second substrates opposing each other; an organic light emitting layer formed between the first and second substrates; a liquid crystal layer formed between the first and second substrates; and a circuit configured to selectively drive the organic light emitting layer or liquid crystal layer so as to display an image.

DETAILED DESCRIPTION

Hereinafter, embodiments will be described with reference to the drawings.

Figure 1:
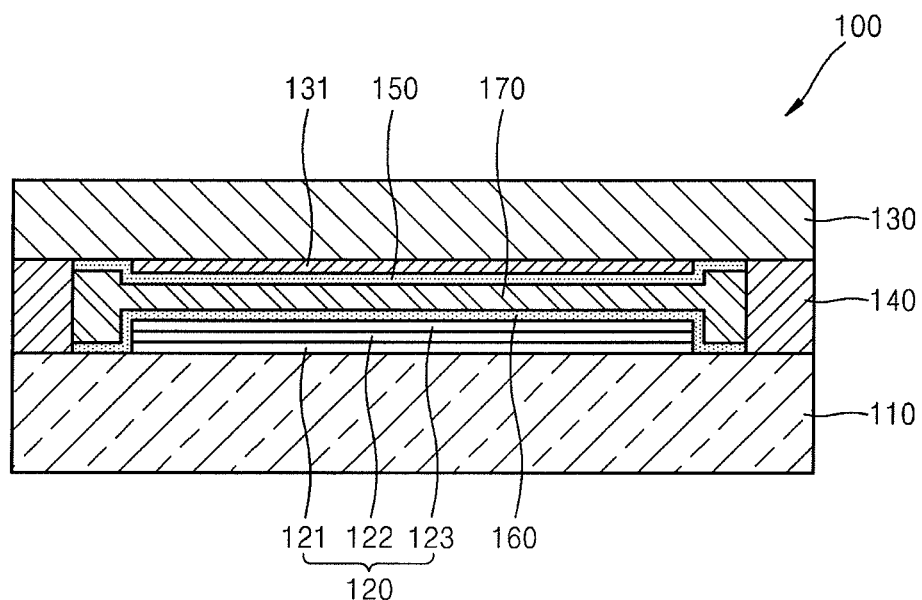
FIG. 1 is a cross-sectional view illustrating a flat panel display device according to an embodiment.

FIG. 1 is a cross-sectional view illustrating a flat panel display device 100 according to an embodiment. As shown in FIG. 1, the flat panel display device 100 includes a first substrate 110, an organic light emitting device 120, a second substrate 130, a sealant 140, a first alignment layer 150, a second alignment layer 160, and a liquid crystal layer 170.

The first substrate 110 may be formed of a transparent glass material including $SiO_2$ as a main component. However, in a case of a top emission type in which an image is realized in an opposite direction of the first substrate 110, the first substrate 110 may not be necessarily formed of a transparent material.

Although not illustrated in FIG. 1, a buffer layer (not shown), for example, $SiO_2$ and/or $SiN_x$, (where x is a natural number) may be further formed on the top surface of the first substrate 110 to smoothen the first substrate 110 and prevent penetration of impurities.

An organic light emitting device 120 is formed on a part of the first substrate 110. The organic light emitting device 120 includes a first electrode layer 121, a second electrode layer 123 facing the first electrode layer 121, and an organic light emitting layer 122 interposed therebetween.

In one embodiment, a pattern of the first electrode layer 121 has line stripes (which are respectively spaced a predetermined interval apart from each other) in a case of a passive matrix (PM) type and has a form corresponding to a pixel in an active matrix (AM) type. In the AM type, a thin film transistor (TFT) layer including at least one TFT may be further provided on the first substrate 110 to be below the first electrode layer 121, and the first electrode layer 121 may be electrically connected to the TFT layer (not shown). The first electrode layer 121 is electrically connected to an external terminal (not shown) on the first substrate 110 and thus may serve as an anode electrode.

The second electrode layer 123 is disposed on the first electrode layer 121 and is electrically connected to an external terminal (not shown) on the first substrate 110 and thus may serve as a cathode electrode. The second electrode layer 123 may have a stripe form substantially perpendicular to the pattern of the first electrode layer 121 in the PM type or may be formed over an entire active region where an image is realized in the AM type. Of course, polarities of the first and second electrode layer 121 and 123 may be reversed.

The flat panel display device 100 may be a top emission type in which an image is realized in an opposite direction of the first substrate 110. In this embodiment, the first electrode layer 121 may serve as a reflective electrode and the second electrode layer 123 may serve as a transparent electrode. Further, in this embodiment, the first electrode layer 121 may be formed at least partially of a reflective material and the second electrode layer 123 may be formed at least partially of a transparent material. In one embodiment, after a reflective layer is formed using Ag, Mg, Al, Pt, Pd, Au, Ni, Nd, Ir, Cr, Li, Ca, or a compound thereof, ITO, IZO, ZnO, or $In_2O_3$ having a high work function is formed on the reflective layer in order to form the reflective electrode of the first electrode layer 121. In one embodiment, after a metal having a small work function such as Ag, Mg, Al, Pt, Pd, Au, Ni, Nd, Ir, Cr, Li, Ca, or a compound thereof is deposited, an auxiliary electrode layer or a bus electrode line is formed thereon using a transparent conductive material such as ITO, IZO, ZnO, or $In_2O_3$ in order to form the transparent electrode of the second electrode layer 123.

The flat panel display device 100 may be a bottom emission type where an image is displayed in a direction of the first substrate 110. In this embodiment, the first electrode layer 121 may be formed at least partially of a transparent material and the second electrode layer 123 may be formed at least partially of a reflective material. In one embodiment, the first electrode layer 121 is formed of ITO, IZO, ZnO, or $In_2O_3$ having a high work function and the second electrode layer 123 is formed of a metal having a small work function such as Ag, Mg, Al, Pt, Pd, Au, Ni, Nd, Ir, Cr, Li, and Ca.

Moreover, in a case of a dual-sided emission type, the first electrode layer 121 and the second electrode layer 123 may be formed as a transparent electrode.

The organic light emitting layer 122 may be interposed between the first electrode layer 121 and the second electrode layer 123. The organic light emitting layer 122 emits light by the electrically driven first and second electrode layers 121 and 123. The organic light emitting layer 122 may be formed of a high or low molecular weight organic matter.

If the organic light emitting layer 122 is formed of a low molecular weight organic matter, a hole transport layer (HTL) and a hole injection layer (HIL) are stacked in a direction of the first electrode layer 121 with respect to the organic light emitting layer 122, and an electron transport layer (FTL) and an electron injection layer (EIL) are stacked in a direction of the second electrode layer 123 with respect to the organic light emitting layer 122. Besides these layers, various kinds of layers may be stacked, depending on the embodiment. Available organic matters may include copper phthalocyanine (CuPc), N,N'-Di(naphthalene-1-yl)-N,N'-diphenyl-benzidine (NPB), and tris-8-hydroxyquinoline aluminium (Alq3).

In addition, in a case of a high molecular weight organic layer formed of a high molecular weight organic matter, only the HTL may be included in a direction of the first electrode layer 121 with respect to the organic light emitting layer 122. The HTL may be formed of poly-(2,4)-ethylene-dihydroxy thiophene (PEDOT) or polyaniline (PANI), and the high molecular weight organic light emitting layer 122 may be formed of PPV, Soluble PPVs, Cyano-PPV, or Polyfluorene.

Accordingly, the flat panel display device 100 displays an image on an organic light emitting device because the organic light emitting layer 122 emits light. The organic light emitting layer 112 emits light through the combining of electrons and holes when voltage is externally applied.

The second substrate 130 for sealing the organic light emitting device 120 from the outside is disposed on the organic light emitting device 120. In a case of the top emission type, the second substrate 130 is a transparent substrate.

An electrode layer 131 of an In-Plane Switching (IPS) mode (hereinafter referred to as an IPS mode electrode layer 131) is disposed on the bottom surface of the second substrate 130 facing the first substrate 110. The IPS mode electrode layer 131 is formed to be substantially parallel to the side of the second substrate 130 facing the first substrate 110 and drives the liquid crystal layer 170 (described below) in a horizontal electric field mode, such that a wider viewing angle can be realized than a conventional vertical electric field mode.

Although not illustrated in the drawings, the IPS mode electrode layer 131 may include a pixel electrode (not shown) or a common electrode (not shown), and may be formed through various kinds of patterning processes. The IPS mode electrode layer 131 including the pixel electrode (not shown) and the common electrode (not shown) is electrically connected to an external terminal (not shown) on the second substrate 130, and thus may serve as an anode or a cathode. In the present embodiment, the IPS mode electrode layer 131 serves as a transparent electrode formed of, for example, ITO, IZO, ZnO, or $In_2O_3$.

In one embodiment, the sealant 140 is formed at the edge portions of the first substrate 110 or the second substrate 130. The second substrate 130 is attached to the first substrate 110 by the sealant 140, and thus the organic light emitting device 120 is protected from external moisture or oxygen penetration. Like the present embodiment, if a glass substrate is used as the second substrate 130, frit glass may be used as the sealant 140. By using a sealant with an excellent sealing force such as the frit glass, external moisture and oxygen penetration can be prevented without an additional moisture absorbent in a sealing space.

The first alignment layer 150 is formed on the IPS mode electrode 131 of the second substrate 130. The first alignment layer 150 is used to arrange the liquid crystal layer 170 (described below) in a predetermined direction, and is formed by coating a high molecular layer such as a polyimide layer. Especially, according to the present embodiment, the first alignment layer 150 may be aligned at about 45 degrees with respect to the surface of the first substrate 130.

The second alignment layer 160 is formed over the first substrate 110 and on the organic light emitting device 120. The second alignment layer 160 is aligned in substantially the same direction as the first alignment layer 150. Thus, the second alignment layer 160 is aligned at about 45 degrees with respect to the surface of the second substrate 130.

The liquid crystal layer 170 is disposed in an inner space formed by the first substrate 110, the second substrate 130, and the sealant 140. The liquid crystal layer 170 absorbs and cools heat emitted from the organic light emitting device 120, and fills the inner space of the flat panel display device 100, thereby preventing damage to the flat panel display device 100 from an external impact.

Furthermore, the liquid crystal layer 170 where an initial alignment is determined between the first alignment layer 150 and the second alignment layer 160 is driven by a parallel electric field, which is formed on the IPS mode electrode layer 131 of the second substrate 130, once a voltage is externally applied. Therefore, an image is displayed by a liquid crystal display (LCD). Moreover, the LCD according to the present embodiment may be configured as a reflective type device without an additional backlight.

In summary, the display device functions as an LCD if an electrical signal such as voltage is applied to the IPS mode electrode layer 131. Further, the display device functions as an OLED if an electrical signal such as voltage is applied to the first and second electrode layers 121 and 123. Accordingly, the flat panel display device may include a dual display of an LCD and an OLED. Moreover, since the liquid crystal is used as a filling material, heat dissipation and internal impact resistance can be improved.

Hereinafter, a flat panel display device according to another embodiment is described with reference to FIG. 2.

Figure 2:
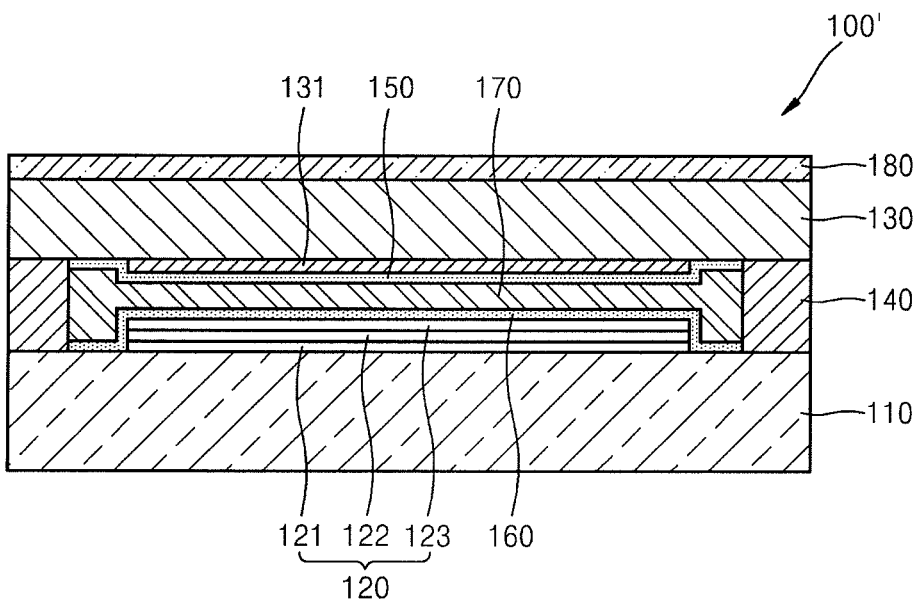
FIG. 2 is a cross-sectional view illustrating a flat panel display device according to another embodiment.

FIG. 2 is a cross-sectional view illustrating a flat panel display device 100' according to another embodiment of the present invention.

As shown in FIG. 2, the flat panel display device 100' includes a first substrate 110, an organic light emitting device 120, a second substrate 130, a sealant 140, a first alignment layer 150, a second alignment layer 160, a liquid crystal layer 170, and a linear polarization film 180. Hereinafter, differences between the FIG. 1 embodiment and the FIG. 2 embodiment will be mainly described and like reference numerals refer to like elements.

The organic light emitting device 120 including the first electrode layer 121, the organic light emitting layer 122, and the second electrode layer 123 is disposed on a part of the first substrate 110.

A pattern of the first electrode layer 121 and the second electrode layer 123 may include an AM type pattern or a PM type pattern, and may be electrically connected to an external terminal (not shown) on the first substrate 110 to serve as an anode or a cathode. Once a voltage is externally applied, the organic light emitting layer 122 emits light because of the combining of electrons and holes such that an image is realized on the flat panel display device 100.

In one embodiment, the flat panel display device 100' is a top emission type. Thus, the first electrode layer 121 serves as a reflective electrode and the second electrode layer 123 serves as a transparent electrode.

In one embodiment, after a reflective layer is formed using Ag, Mg, Al, Pt, Pd, Au, Ni, Nd, Ir, Cr, Li, Ca or a compound thereof, ITO, IZO, ZnO, or $In_2O_3$ having a high work function is formed thereon in order to form the first electrode layer 121.

In one embodiment, after a metal of a small work function such as Ag, Mg, Al, Pt, Pd, Au, Ni, Nd, Ir, Cr, Li, Ca or a compound thereof is deposited, an auxiliary electrode layer or a bus electrode line is formed thereon using a transparent conductive material such as ITO, IZO, ZnO, or $In_2O_3$ in order to form the second electrode layer 123.

The second substrate 130 for sealing the organic light emitting device 120 from the outside is disposed on the organic light emitting device 120. In the present embodiment, the second substrate 130 is a transparent substrate.

The IPS mode electrode layer 131 is disposed with various kinds of patterns on the side of the second substrate 130 facing the first substrate 110. The IPS mode electrode layer 131 is electrically connected to an external terminal (not shown) on the second substrate 130, and thus may serve as an anode or a cathode.

In the present embodiment, the IPS mode electrode layer 131 serves as a transparent electrode formed of, for example, ITO, IZO, ZnO, or $In_2O_3$.

The first substrate 110 and the second substrate 130 are bonded using the sealant 140. The first alignment layer 150 is formed on the IPS mode electrode layer 131 of the second substrate 130, and the second alignment layer 160 is formed on the first substrate 110 and the organic light emitting device 120. The first and second alignment layers 150 and 160 are used to align the liquid crystal layer 170 in a predetermined direction, and a high molecular layer such as polyimide is coated therefor. In one embodiment, the first alignment layer 150 is aligned at about 45 degrees with respect to the second substrate 130.

The liquid crystal layer 170 is provided in an inner space formed by the first substrate 110, the second substrate 130, and the sealant 140. The liquid crystal layer 170 absorbs and cools heat emitted from the organic light emitting device 120, and fills the inner space of the flat panel display device 100', thereby preventing damage to the flat panel display device 100' from an external impact.

In addition, the liquid crystal layer 170 of which an initial alignment is determined between the first alignment layer 150 and the second alignment layer 160 is driven by a parallel electric field formed at the IPS mode electrode layer 131 of the second substrate 130 once a voltage is externally applied. Thereby, an image is realized on an LCD. In one embodiment, the LCD may include a reflective device without an additional backlight.

Moreover, the liquid crystal layer 170 is aligned at about 45 degrees with respect to the surface of the second substrate 130 when no external voltage is applied. Therefore, the liquid crystal layer 170 serves as a ¼ of the wavelength phase difference plate in an OLED device.

The linear polarization film 180 is provided on the side of the second substrate 130, which is opposite to a side of the second substrate 130 facing the first substrate 110.

Due to external light, contrast and visibility are deteriorated in an OLED device. To resolve this, a conventional OLED device includes a circular polarization film, which is manufactured by bonding a multi-layered polarization film and phase difference film. However, since the circular polarization film is manufactured using the bonded multi-layered films, it is difficult to produce a thin display device because of its complex manufacturing process, expensive cost, and thick thickness.

In one embodiment, in the flat panel display device 100', since the liquid crystal layer 170 serves as a ¼ wavelength phase difference plate, only the thin linear polarization film 180 instead of a thick circular polarization film is provided. Accordingly, a thin display device can be realized.

Furthermore, an adhesive layer (not shown) may be further provided between the second substrate 130 and the linear polarization film 180.

In one embodiment, the flat panel display device may have a dual display of an LCD and an organic light emitting device. In addition, since liquid crystal is used as a filling material, heat dissipation and internal impact resistance can be improved. In one embodiment, since liquid crystal serving as a ¼ wavelength phase difference plate is used and only a linear polarization film instead of a conventional circular polarization film is attached at an external light incident side, external light visibility can be improved and the thickness of a device can be reduced.

Hereinafter, a method of manufacturing a flat panel display device, according to an embodiment, will be described with reference to FIGS. 3 through 7.

FIGS. 3 through 7 are cross-sectional views illustrating a method of manufacturing a flat panel display device, according to an embodiment.

Figure 3A:
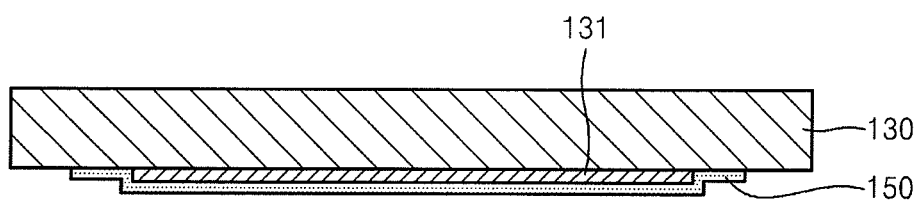
FIGS. 3 through 7 are cross-sectional views illustrating a method of manufacturing a flat panel display device, according to an embodiment.
Figure 3B:
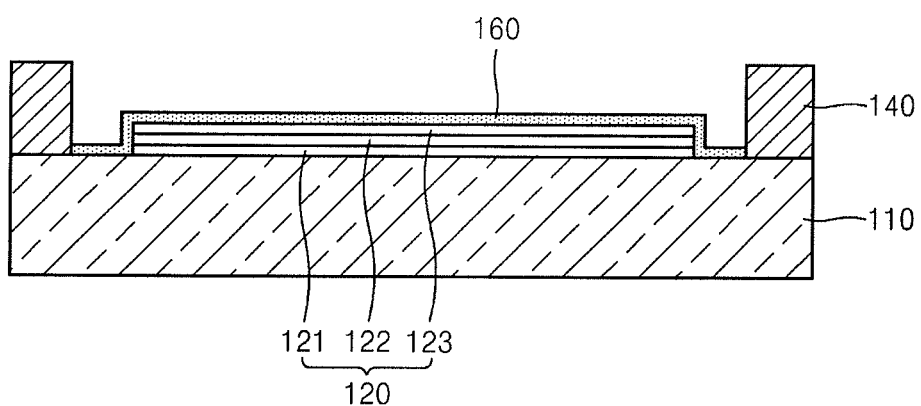

Referring to FIG. 3A, a second substrate 130 having an IPS mode electrode layer 131 is prepared and a first alignment layer 150 is coated on the second substrate 130 to cover the IPS mode electrode layer 131. In addition, referring to FIG. 3B, a first substrate 110 is prepared as a light emitting substrate having an organic light emitting device 120, and a second alignment layer 160 is coated on the first substrate 110. In the present embodiment, a high molecular weight layer such as polyimide is coated and used as the first and second alignment layers 150 and 160.

An external terminal (not shown) that is electrically connected to a first electrode layer 121 and a second electrode layer 123 of the organic light emitting device 120 is formed on the first substrate 110 substantially simultaneously during the forming of the first electrode layer 121 and the second electrode layer 123. Moreover, an external terminal (not shown) that is electrically connected to the IPS mode electrode layer 131 is formed on the second substrate 130 substantially simultaneously during the forming of the IPS mode electrode layer 131.

Referring to FIG. 2B, although a sealant 140 is formed first on the edge portions of the first substrate 110 before the coating of the second alignment layer 160, the order may be changed. That is, after the second alignment layer 160 is coated, the sealant 140 may be disposed at the edge portions of the first substrate 110. In addition, as shown in FIG. 2B, after the sealant 140 is formed on the edge portions of the first substrate 130, the sealant 140 is attached to the second substrate 130, but it is possible that after the sealant 140 is formed on the edge portions of the second substrate 130, the sealant 140 is attached to the first substrate 110.

Figure 4A:
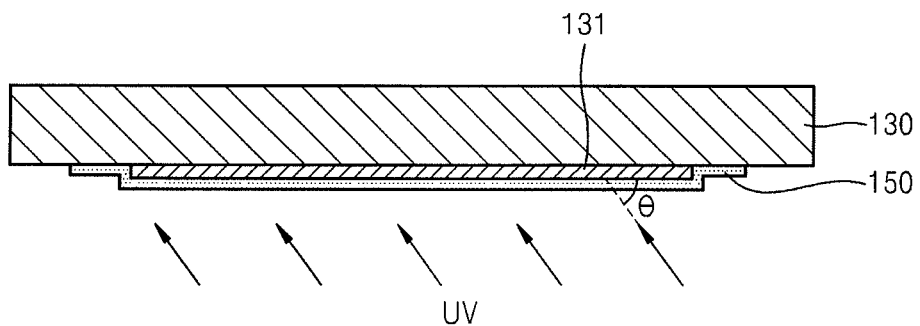
Figure 4B:
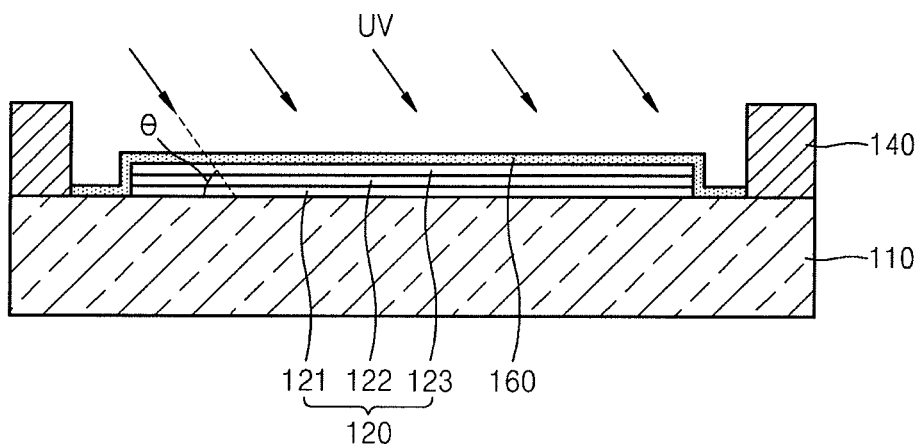

In one embodiment, as shown in FIGS. 4A and 4B, ultraviolet (UV) light is projected on the first and second alignment layers 150 and 160. The first and second alignment layers 150 and 160 may be aligned through various kinds of methods in order to align the liquid crystal layer 170 in a predetermined direction. A method of manufacturing an alignment layer may be a contact type method such as a rubbing method where a polyimide surface is rubbed in a predetermined direction with a fiber such as nylon or polyester, and a non-contact type method such as a photo alignment method, an energy beam alignment method, a vapor deposition alignment method, and a lithography alignment method. In the present embodiment, the photo alignment method, in which UV light is projected on the coated polyimide thin layer to control molecular characteristics of an alignment layer, is used.

In the present embodiment, the first alignment layer 150 is aligned at a tilt angle θ (e.g., about 45 degrees) with respect to the second substrate 130. Since the second alignment layer 160 is aligned in substantially the same direction as the first alignment layer 150, the second alignment layer 160 is aligned at about 45 degrees with respect to the second substrate 130.

Figure 5:
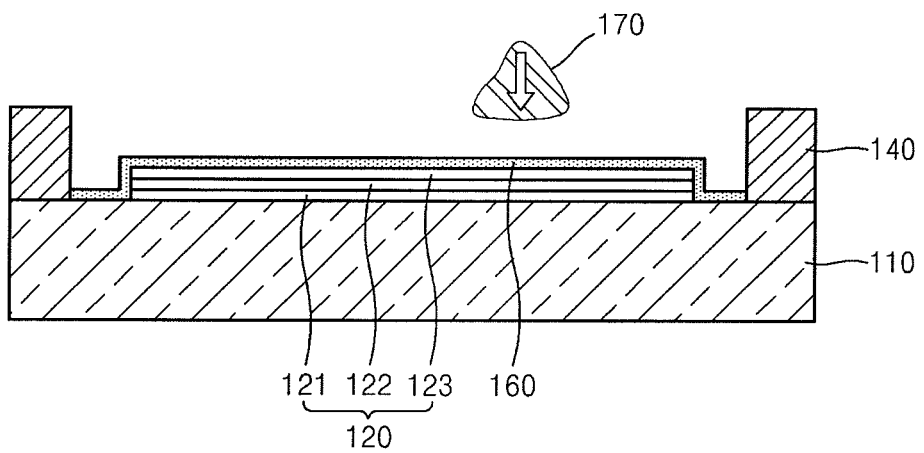

Referring to FIG. 5, a liquid crystal material is injected into the second substrate 130 having the first alignment layer 150 to form the liquid crystal layer 170.

Figure 6:
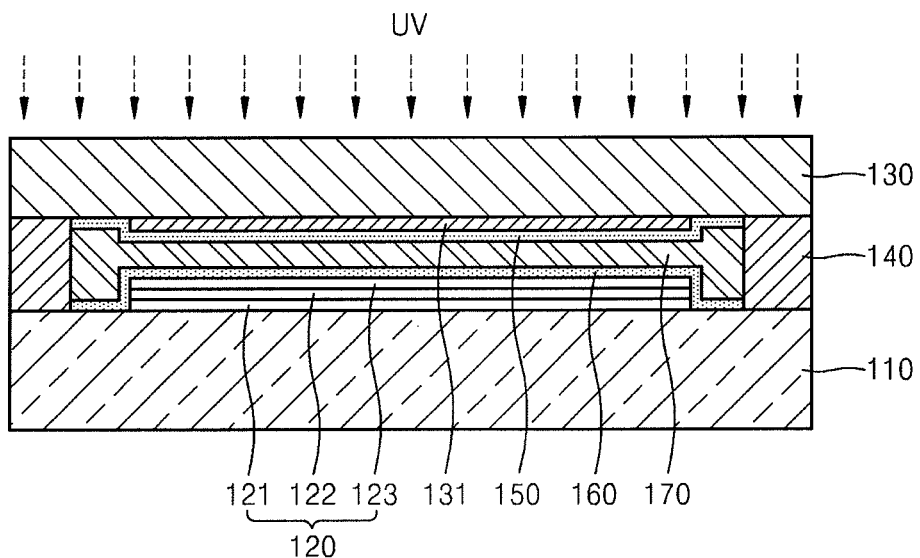

Referring to FIG. 6, the second substrate 130 with the injected liquid crystal layer 170 is attached to the first substrate 110 by using the sealant 140, and the liquid crystal layer 170 injected into an inner space formed by the first substrate 110, the second substrate 130, and the sealant 140 is hardened by UV light. Thereby, the liquid crystal layer 170 serves as a ¼ wavelength phase difference plate. In addition, the liquid crystal layer 170 absorbs and cools heat emitted from the organic light emitting device 120, and fills the inner space of a device, thereby preventing damage to the flat panel display device from an external impact.

Figure 7:
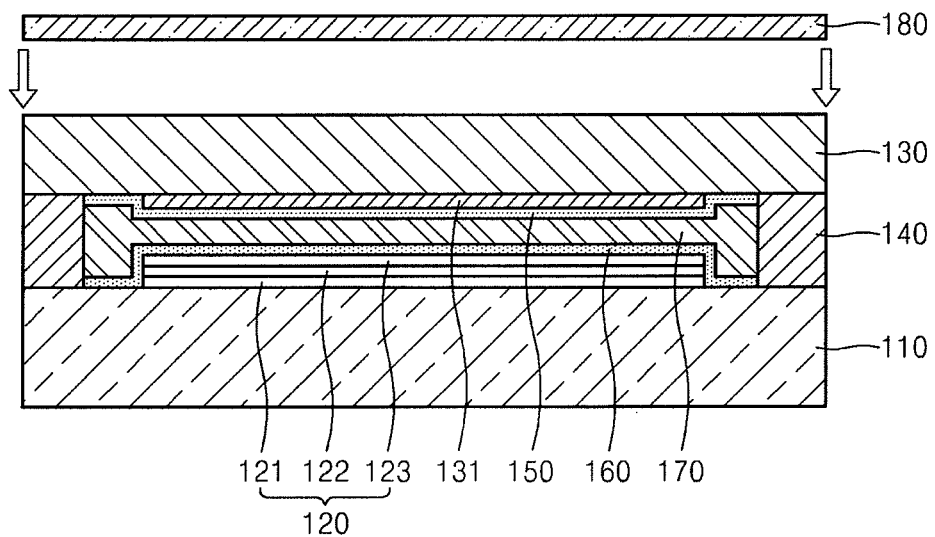

Referring to FIG. 7, a linear polarization film 180 is attached on the top surface of the substrate 130 of the flat panel display device using a liquid crystal layer 170. Furthermore, although not illustrated in the drawings, it is apparent that an adhesive layer (not shown) may be further provided between the second substrate 130 and the linear polarization film 180. The liquid crystal layer 170 serves as a ¼ wavelength phase difference plate and the linear polarization film 180 may serve as a circular polarization film.

According to at least one embodiment, a dual display of an OLED and an LCD is realized. In addition, since liquid crystal is used as a filling material, heat dissipation and internal impact resistance can be improved. Moreover, a liquid crystal serving as a ¼ wavelength phase difference plate is used and only a linear polarization film instead of a conventional circular polarization film is attached such that external light visibility can be improved and the thickness of a device can be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flat panel display comprising:
   a first substrate;
   an organic light emitting device formed over the first substrate, wherein the organic light emitting device comprises a first electrode layer, an organic light emitting layer, and a second electrode layer, and wherein the organic light emitting layer is interposed between the first and second electrode layers;
   a second substrate attached to the first substrate by the use of a sealant;
   an In-Plane Switching (IPS) mode electrode layer formed between the first and second substrates, wherein the IPS mode electrode layer is closer to the second substrate than the first substrate, wherein the IPS mode electrode layer has first and second surfaces opposing each other, wherein the first surface is closer to the second substrate than the first surface, and wherein the width of the IPS mode electrode layer is substantially the same as the width of the organic light emitting device;
   a first alignment layer formed on the second surface of the IPS mode electrode layer; and
   a liquid crystal layer filled in a space formed between the first substrate and the second substrate, wherein at least part of the liquid crystal layer is formed between the IPS mode electrode layer and the organic light emitting device.

2. The display of claim 1, wherein at least one of the first electrode layer and the second electrode layer is formed at least partially of a reflective material and wherein the IPS mode electrode layer is formed at least partially of a transparent material.

3. The display of claim 1, wherein the liquid crystal layer is configured to display an image based on a voltage applied to the IPS mode electrode layer.

4. The display of claim 1, wherein the IPS mode electrode layer is electrically connected to an external terminal formed on the second substrate.

5. The display of claim 1, wherein the organic light emitting layer is configured to display an image based on a voltage applied to the first electrode layer and the second electrode layer.

6. The display of claim 1, wherein the first electrode layer and the second electrode layer are electrically connected to an external terminal formed on the first substrate.

7. The display of claim 1, further comprising a second alignment layer formed over the first substrate and the organic light emitting device, wherein the second alignment layer is aligned in substantially the same direction as the first alignment layer.

8. The display of claim 7, wherein the first and second alignment layers are aligned at about 45 degrees with respect to at least one of a first surface of the first substrate and a second surface of the second substrate, and wherein the sealant contacts the first surface of the first substrate and the second surface of the second substrate.

9. The display of claim 7, wherein the first and second alignment layers are formed at least partially of polyimide.

10. The display of claim 1, wherein the sealant is glass frit.

11. The display of claim 1, further comprising a linear polarization film, wherein the second substrate has first and second surfaces opposing each other, wherein the first surface of the second substrate contacts the sealant, and wherein the linear polarization film is formed over the second surface of the second substrate.

12. The display of claim 11, wherein the first electrode layer is formed at least partially of a reflective material, wherein the second electrode layer is formed at least partially of a transparent material and wherein the IPS mode electrode layer is formed at least partially of a transparent material.

13. The display of claim 11, further comprising an adhesive material formed between the second substrate and the linear polarization film.

14. A flat panel display comprising:
first and second substrates opposing each other;
an In-Plane Switching (IPS) mode electrode layer formed between the first and second substrates;
an organic light emitting layer formed between the first and second substrates;
a liquid crystal layer formed between the first and second substrates; and
a circuit configured to selectively drive the organic light emitting layer or liquid crystal layer so as to display an image,
wherein the width of the IPS mode electrode layer is substantially the same as the width of the organic light emitting layer, and
wherein at least part of the liquid crystal layer is formed between the IPS mode electrode layer and the organic light emitting layer.

15. The display of claim 1, wherein the liquid crystal layer and the organic light emitting device overlap each other in a direction extending from the first substrate to the second substrate.

16. The display of claim 1, wherein the liquid crystal layer is wider than the organic light emitting device.

17. The display of claim 1, wherein the sealant directly contacts the liquid crystal layer, and the first and second alignment layers.

18. The display of claim 1, wherein the first alignment layer covers and contacts three different surfaces of the IPS mode electrode layer.

* * * * *